United States Patent [19]

Nakamura et al.

[11] Patent Number: 4,812,894

[45] Date of Patent: Mar. 14, 1989

[54] SEMICONDUCTOR DEVICE

[75] Inventors: Tohru Nakamura, Tanashi; Kazuo Nakazato; Noriyuki Homma, both of Kokubunji; Kazuhiko Sagara, Tokyo; Takeo Shiba, Kodaira; Tokuo Kure, Kokubunji; Tetsuya Hayashida, Tokyo, all of Japan

[73] Assignee: Hitachi, Ltd., Tokyo, Japan

[21] Appl. No.: 191,761

[22] Filed: May 3, 1988

Related U.S. Application Data

[63] Continuation of Ser. No. 848,473, Apr. 7, 1986, abandoned.

[30] Foreign Application Priority Data

Apr. 8, 1985 [JP] Japan .................................. 60-72681

[51] Int. Cl.⁴ ............................................ H01L 29/06
[52] U.S. Cl. .......................................... 357/55; 357/4; 357/23.4; 357/23.6; 357/34; 357/49; 357/50; 357/59; 357/68; 357/71; 357/67
[58] Field of Search .................. 357/4, 23.4, 23.6, 34, 357/49, 50, 55, 59, 67, 68, 71

[56] References Cited

U.S. PATENT DOCUMENTS

| | | | |
|---|---|---|---|
| 4,418,468 | 12/1983 | Vora et al. | 357/50 |
| 4,512,075 | 4/1984 | Vora | 357/34 |
| 4,571,817 | 2/1986 | Birritella et al. | 357/34 |

Primary Examiner—Edward J. Wojciechowicz
Attorney, Agent, or Firm—Antonelli, Terry & Wands

[57] ABSTRACT

A semiconductor device includes a first insulation film formed on a monocrystalline substrate and having an opening, a monocrystalline semiconductor layer formed so as to protrude into the first insulation film, and a conductive layer formed in contact with the side section of the monocrystalline semiconductor layer and extending over a second insulation film formed on the monocrystalline semiconductor layer.

16 Claims, 4 Drawing Sheets

SEMICONDUCTOR DEVICE

This application is a continuation of application Ser. No. 848,473, filed Apr. 7, 1986 now abandoned.

BACKGROUND OF THE INVENTION

This invention relates to a semiconductor device and, particularly, to a semiconductor device suitable for reducing the size without lowering the current capacity of transistors.

Bipolar transistors have the advantages of higher operating speed and larger current driving ability over field effect transistors. In order to further speed up the bipolar transistor operation, the transistors are dimensioned more finely in both the lateral and vertical directions. However, as a result of the reduction in the dimensions of a transistor, the "outer base region" for leading out the base terminal becomes larger than the intrinsic base region which exists beneath the emitter region and provides the essential transistor operation. The outer base region creates a larger parasitic capacitance and therefore the further speed-up of the transistor cannot be expected.

FIG. 1 shows an example of the transistor structure which overcomes the above-mentioned problem to achieve the speed-up of the transistor, and such a semiconductor structure is disclosed, for example, in Japanese Patent Unexamined Publication Nos. 56-1556 and 58-73156. In FIG. 1, the semiconductor structure includes a p-type silicon substrate 1, an n-type buried layer 2, an insulation film 3 made of silicon oxide, an n-type collector region 4, a p-type intrinsic base region 5, an outer base region 6' made of polycrystalline silicon for leading out the base terminal, an n-type emitter region 7', an emitter electrode 8', a base electrode 9', and a collector electrode 10'. In the conventional transistor structure shown in the figure, the intrinsic base region 5' has its side wall 11 connected to the outer base region 6', to which the base electrode 9 is connected. The outer base region 6' is formed on the thick insulation film 3, and therefore the parasitic capacitance between the base and collector is small. Consequently, the speed reduction due to the parasitic capacitance is prevented, and the high-speed transistor operation is accomplished.

However, in order for the transistor to have a further enhanced performance, it needs much smaller dimensions for the emitter region. Since the maximum allowable current density of the transistor cannot be changed, the reduced emitter area results in the reduction in the current capacity of the transistor. Conventionally, when the emitter width has been reduced, the emitter length has been increased to compensate for the emitter width reduction, thereby preventing a lowering of the transistor current capacity. However, it is obvious that such a conventional semiconductor structure cannot make the transistor area smaller, and this has been a barrier to the higher integration of transistors.

SUMMARY OF THE INVENTION

The present invention is intended to overcome the foregoing prior art deficiencies, and its prime object is to provide a semiconductor device which is smaller in dimensions, larger in the current capacity, and faster in the operation, as compared with the conventional ones.

In order to achieve the above objectives, the inventive semiconductor device includes an active region formed in the protrudent portion on the semiconductor substrate, and at least one conductive layer being in contact with at least one of the side or front face of the active region and extending over an insulation film to the top of the active region, with the conductive layer being in connection with the electrode at the position above the active region. According to the inventive semiconductor structure, the conductive layer in contact with the active region at its side or front surface is formed to extend over the active region, at which position the conductive layer is connected to the electrode, whereby dimensions of device elements can be reduced by utilization of spaces which have been left unused in the conventional semiconductor device. The inventive semiconductor structure is also capable of increasing the area of the active region relative to the total area of the overall semiconductor device, whereby enhanced operating speed and current capacity can be achieved.

DESCRIPTION OF THE PREFERRED EMBODIMENTS

Figure 2:
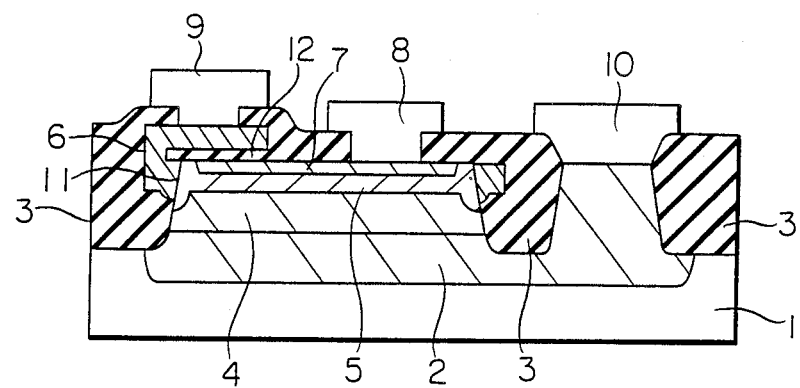
FIG. 2 is a sectional diagram showing an embodiment of this invention.

FIG. 2 shows the first embodiment of this invention, in which a p-type silicon substrate 1 has the formation of an n-type buried layer 2 in its surface region and the formation of an n-type collector region 4, a p-type intrinsic base region 5 and an n-type emitter region 7 in its protrudent active region. An outer base 6 made of low-resistance p-type polycrystalline silicon is provided to extend over a silicon oxide insulation film 12 formed on the emitter region 7 and in contact with the side wall (side face) 11 of the intrinsic base region 5. A base electrode 9 is provided in connection with the outer base region 6 above the emitter region 7.

Figure 1:
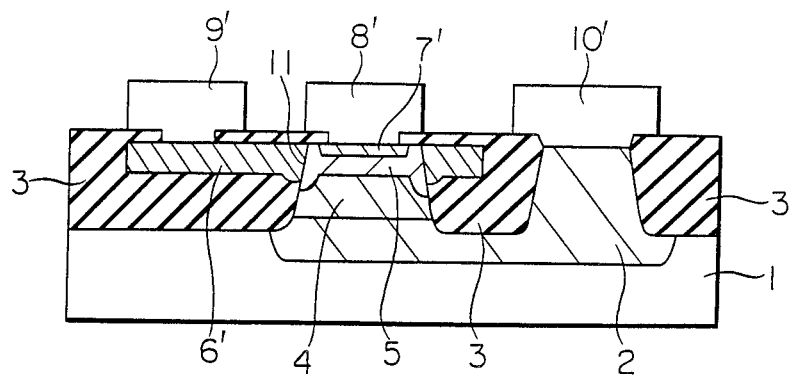
FIG. 1 is a diagram showing the sectional structure of the conventional bipolar transistor.
Figure 3:
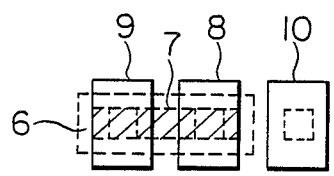
FIGS. 3 and 4 are diagrams used to compare the necessary layout areas of the inventive and conventional semiconductor devices, respectively.
Figure 4:
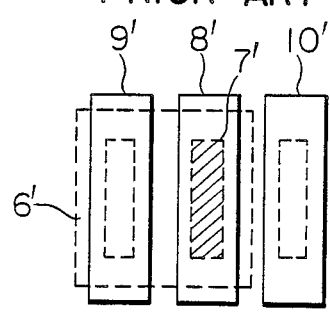

FIGS. 3 and 4 are plane views showing the inventive and conventional transistor structures, respectively, having the same dimensions of the emitter region, i.e., 1 μm by 4 μm. In the conventional transistor structure, as can be seen from FIGS. 4 and 1, the emitter region 7' is formed only beneath the emitter electrode 8', and outer base region 6' does not extend over the emitter region 7'. In the inventive transistor structure, as can be seen from FIGS. 3 and 2, the emitter region 7 extends beneath the base electrode 9, and the total area of the transistor with the emitter region (7, 7') of a substantially equal size is reduced to about ⅓ of the conventional structure shown in FIGS. 4 and 1. If the same total area of a transistor is specified, the inventive structure can have an incomparably larger emitter area than the conventional structure, and the current capacity of the transistor can be increased. Accordingly, this embodiment enables the emitter region 7 to extend to the portion which has not been used effectively due to the presence of the outer base region, whereby the dimensions of a transistor can be reduced, and also enables the emitter region to have an increased area relative to the total area of a transistor, whereby the operating speed and current capacity can be enhanced.

FIGS. 5a–5e show the processing steps for fabricating the structure of the foregoing a first embodiment of this invention.

Figure 5A:
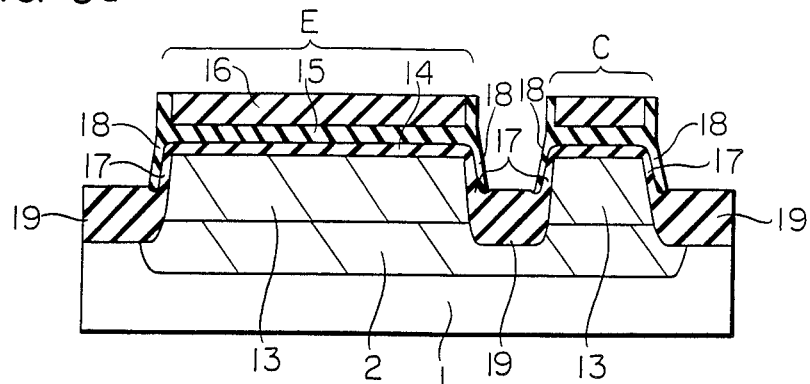
FIGS. 5a to 5e are sectional diagrams showing the fabricating steps of the inventive semiconductor device.

Initially, antimony is diffused in a specified portion of a p-type silicon substrate 1 by the thermal diffusion process, and an n-type buried layer 2 in an impurity concentration of $3\times10^{19}$ cm$^{-3}$ is formed to a depth of 1 $\mu$m, as shown in FIG. 5a. Next, an epitaxial layer 13 is formed to a thickness of 1 $\mu$m by the epitaxial growth process. Subsequently, an SiO$_2$ film 14 of 50 nm in thickness is formed by the thermal oxidation process, an Si$_3$N$_4$ film 15 of 120 nm in thickness is formed by the CVD process and an SiO$_2$ oxide film 16 of 900 nm in thickness is formed sequentially on the epitaxial layer 13, and protrudent portions E and C are formed by etching off the remaining portions by the photolithographic process. Using the SiO$_2$ film 14, Si$_3$N$_4$ film 15 and SiO$_2$ oxide film 16 as a mask, the silicon substrate 1 is etched to a depth of 0.7 $\mu$m. After thermal oxidation for the exposed portions of the epitaxial layer 13 and the silicon substrate 1, an Si$_3$N$_4$ film is deposited again. By the reactive ion etching process for the SiO$_2$ film created by the above thermal oxidation and the Si$_3$N$_4$ film formed on it, portions on the horizontal plane are removed, with an SiO$_2$ film 17 and Si$_3$N$_4$ film 18 being left on the side faces of the protrudent regions E and C. Thereafter, thermal oxidation is conducted to form an SiO$_2$ film 19 in a 700 nm thickness as a separator.

Figure 5B:
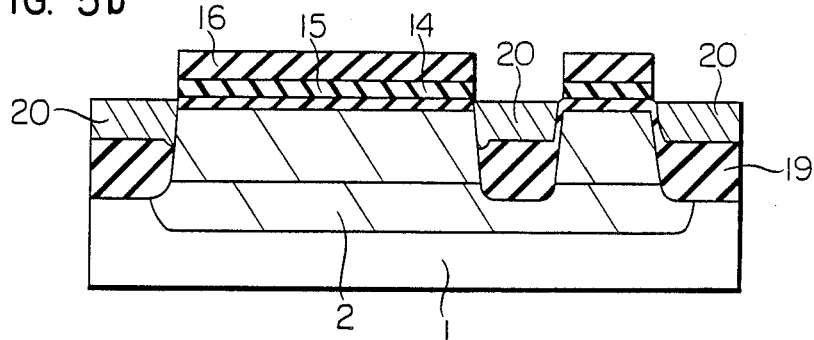

After the SiO$_2$ film 17 and Si$_3$N$_4$ film 18 formed on the side faces of the protrudent regions E and C have been removed by the wet etching process, a polycrystalline silicon layer 20 is deposited to a thickness of 700 nm, as shown in FIG. 5b, and the layers only on the protrudent regions E and C are removed by the wet etching process.

Figure 5C:
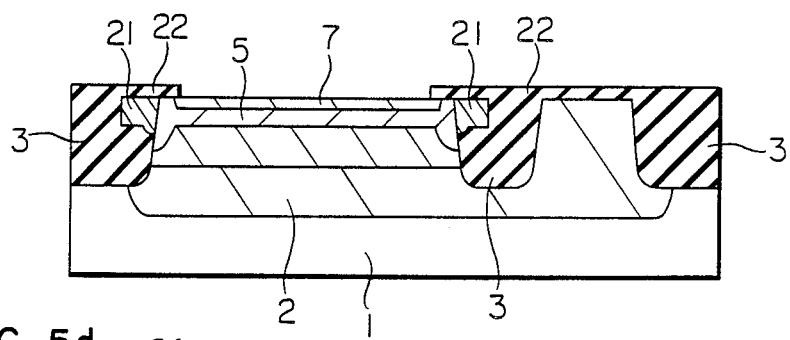

Next, oxidation is conducted for the polycrystalline silicon layer 20 in a portion 21 other than those in contact with the protrudent region E to form an SiO$_2$ film 3 in a 1400 nm thickness, as shown in FIG. 5c.

Ion implantation of boron, i.e., a p-type impurity, is conducted at 30 keV and $1.0\times10^{14}$ cm$^{-2}$ for the polycrystalline silicon layer 21 in contact with the side face of the protrudent region E and, after the anneal process at 900° C. for 20 minutes, the surface of the polycrystalline silicon layer 21 is subjected to thermal oxidation, and an SiO$_2$ film 22 of 0.3 $\mu$m in thickness is formed. After the annealing process at 900° C. for 20 minutes for diffusing the boron impurity in the polycrystalline silicon layer 21, the SiO$_2$ film 6, Si$_3$N$_4$ film 15 and SiO$_2$ film 16 on the surfaces of the protrudent regions E and C are removed by wet etching. Thereafter, ion implantation of p-type impurity boron is conducted at an acceleration voltage of 25 keV and a dose of $1.0\times10^{14}$ cm$^{-2}$ to form a base region 5 in a 0.3 $\mu$m depth, and subsequently ion implantation of n-type impurity arsenic is conducted at an acceleration voltage of 80 keV and a dose of $2.0\times10^{16}$ cm$^{-2}$ to form an emitter region 7 in a 0.15 $\mu$m depth.

Figure 5D:
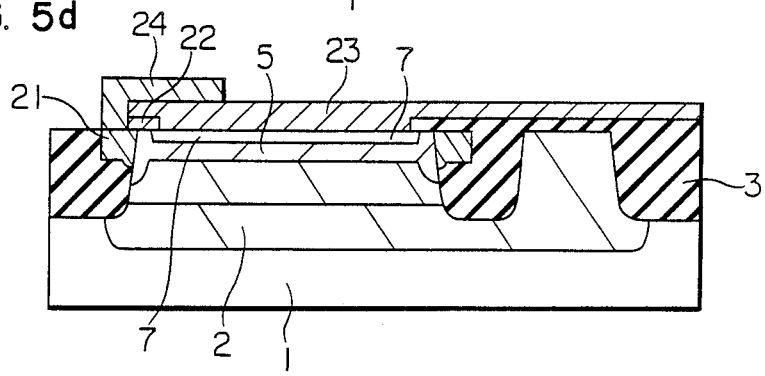

After an SiO$_2$ film 23 has been deposited to a thickness of 600 nm on the entire surface, as shown in FIG. 5d, the SiO$_2$ films 22 and 23 on one of the p-type polycrystalline silicon layers 21 (the left-hand section in FIG. 5c) are removed. After a polycrystalline silicon layer has been deposited to a thickness of 350 nm on the entire surface, unnecessary portions are removed by patterning, and a polycrystalline silicon layer 24 in connection with the polycrystalline silicon layer 21 is formed on the emitter region 7, as shown in FIG. 5d.

Figure 5E:
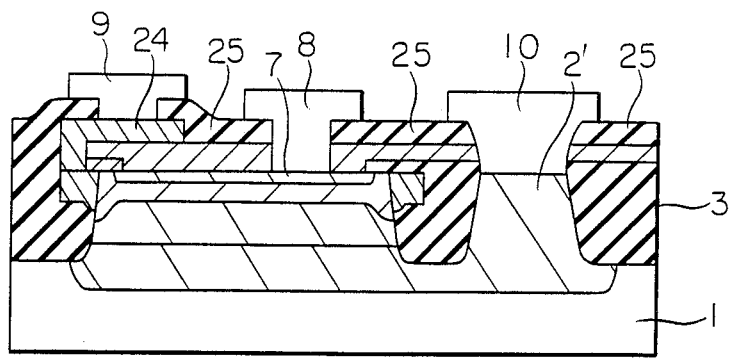

Finally, an SiO$_2$ film 25 is deposited to a thickness of 200 nm on the entire surface, openings are formed through it over the polycrystalline silicon layer 24, emitter region 7 and buried layer 2′, and a base electrode 9, emitter electrode 8 and collector electrode 10 are formed in the openings by a known technique such as photo-etching, as shown in FIG. 5e, and a semiconductor device having the structure shown in FIG. 2 is completed. As will be appreciated from the above description, the inventive semiconductor device can readily be fabricated by application of the conventional processing techniques.

Figure 6:
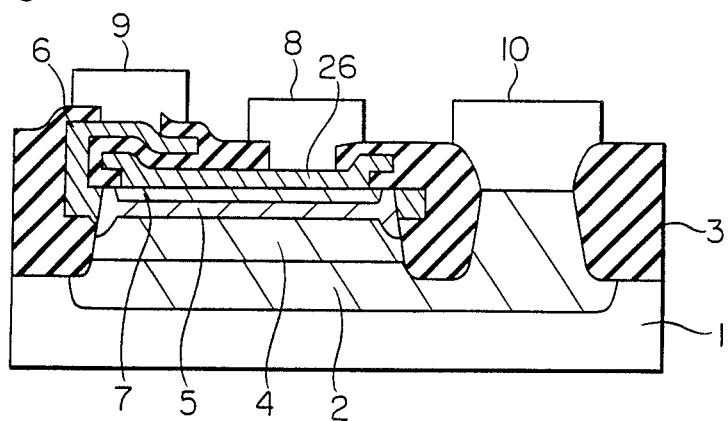
FIGS. 6 to 11 are sectional diagrams showing different embodiments of this invention.

FIG. 6 shows a second embodiment of this invention, in which the emitter region is diffused shallower so as to speed up the operation. In this embodiment, the emitter region 7 is made as thin as 0.3 $\mu$m, and in order to prevent atoms of the emitter electrode 8 from penetrating into the intrinsic base region 5, which results in a short circuit, a polycrystalline or monocrystalline silicon layer 26 is formed on the surface of the emitter region 7. This embodiment is particularly effective for the structure with an emitter diffusion depth of about 0.2 $\mu$m or smaller.

Figure 7:
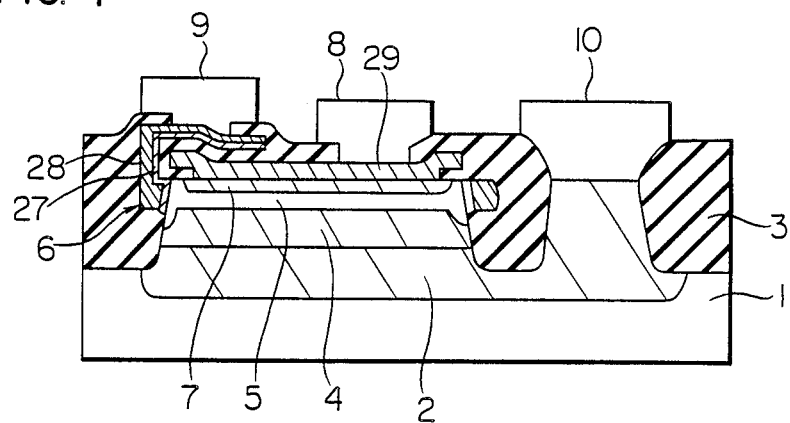

FIG. 7 shows a third embodiment of this invention, which is intended to speed up the operation by reducing the base resistance. In order to reduce the resistance, the outer base 6 is formed of a polycrystalline silicon layer 27 and a metal (Al, a refractory metal such as Mo or Ti) silicide layer 28. By use of the metal silicide layer 28 as part of the outer base, the outer base resistance is reduced to 1/10 or less, and the high-speed transistor operation is achieved. The outer base 6 may entirely be formed of the metal silicide layer 28. This embodiment further includes the formation of a polycrystalline or monocrystalline silicon layer on the emitter region 7 as in the case of the second embodiment, and after a metal such as Mo or Ti has been deposited on this silicon layer the structure is heat processed so that the silicon layer reacts on the metal to produce a metal silicide layer 29. The emitter series resistance is reduced owing to the metal silicide layer 29, and the high-speed transistor operation is achieved.

Figure 8:
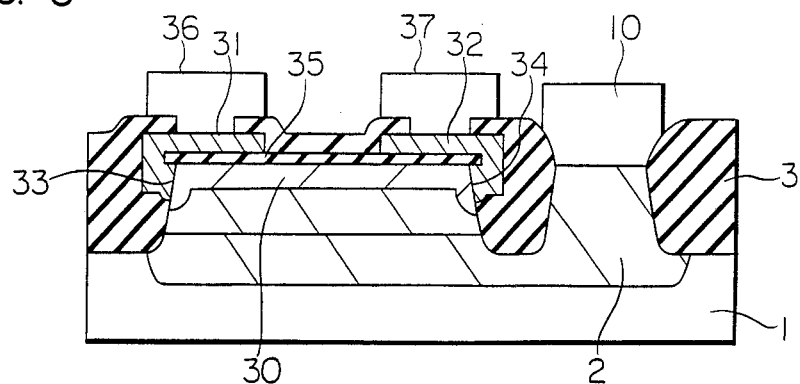

FIG. 8 shows a fourth embodiment of this invention. Different from the preceding embodiments that are bipolar transistors, this embodiment is the application of the present invention to a resistor device. In this embodiment, a p-type diffusion resistance region 30 is formed in the aforementioned protrudent region, with its electrode lead-out regions 31 and 32 being formed in contact with the side walls (side faces) 33 and 34 of the p-type diffusion resistance region 30 and through an SiO$_2$ insulation film 35 formed on the resistance region 30. An electrode 36 led out by the region 31 and another electrode 37 led out by the region 32 are placed above the resistance region 30. By this structure, the dimensions of the resistor can be reduced.

Figure 9:
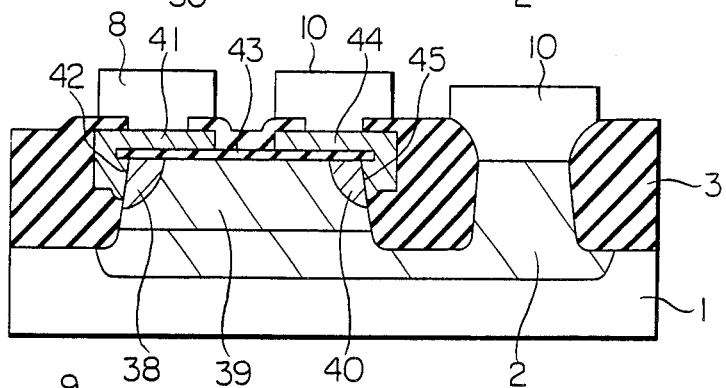

FIG. 9 shows a fifth embodiment of this invention, which is applied to a lateral bipolar transistor. In this embodiment, an n-type emitter region 38, a p-type intrinsic base region 39 and an n-type collector region 40 are formed in the aforementioned protrudent region. An outer emitter 41 for connecting the emitter region 38 to the emitter electrode 8 is provided in contact with the side wall (side face) 42 of the emitter region 38 and over an SiO$_2$ film 43 on the emitter region 38. An outer collector region 44 for connecting the collector region 40 to the collector electrode 10 is provided in contact with the side wall (side face) 45 of the collector region 40 and over an insulation film 43 on the collector region 40. The emitter electrode 8 and collector electrode 10 in connection with the outer emitter 41 and outer collector 44, respectively, are placed above the active regions including the emitter region 38, base region 39 and collector region 40. This embodiment also achieves the reduction of dimensions of the semiconductor device owing to the disposition of the active region beneath the electrodes as in the case of the first embodiment.

Figure 10:
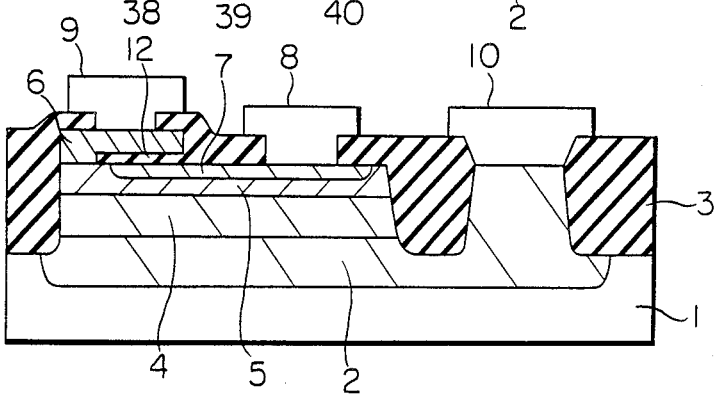

FIG. 10 shows a sixth embodiment of this invention, which is a transistor structure similar to that of the first embodiment shown in FIG. 2. Different from the preceding embodiments in which the conductive layers to be connected to the external electrodes are in contact with the side walls of the active regions, the conductive layer, i.e., the outer base region 6, is provided in this embodiment in contact with the surface of the intrinsic base region 5 and over the insulation film 12 on the intrinsic base region 5. This embodiment has substantially the same effectiveness as of the first embodiment.

Figure 11:
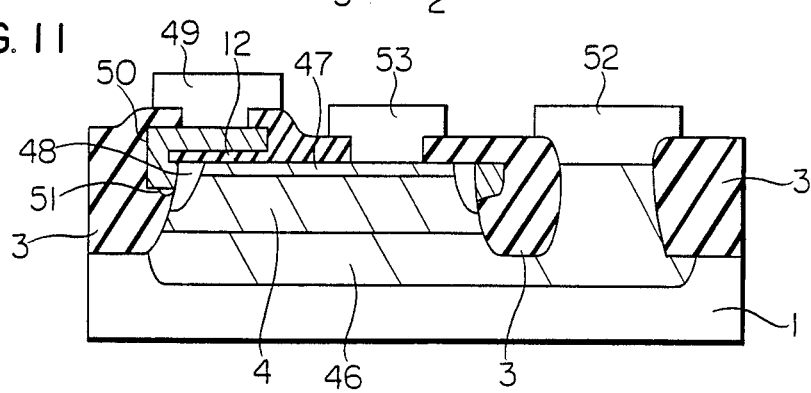

FIG. 11 shows a seventh embodiment of this invention, which is applied to a junction field effect transistor. The structure includes a source region 46 made of an n-type buried layer, an n-type drain region 47 and a gate region 48 made of a p-type impurity region surrounding the n-type drain region 47. A gate electrode 49 is placed above the gate region 48, and both members are connected through a conductive layer 50 provided in contact with the side wall 51 of the gate region 48 and over an insulation film 12 on the drain region 47. The structure includes a source electrode 52 and a drain electrode 53. The junction field effect transistor of this embodiment uses a smaller layout area and yet has a larger current capacity, as in the first embodiment.

The foregoing embodiments can of course be accomplished using other semiconductor material such as GaAs besides silicon. It is of course possible for the inventive semiconductor device structure to exchange the conductivity types p and n.

According to this invention, as will be appreciated from the foregoing description, the semiconductor device can be made smaller by the effective use of spaces which have not been used in the conventional design. The inventive device structure increases the area of the active region relative to the total device area, whereby the operating speed and the current capacity of the semiconductor device can be enhanced. Particularly, a large current capacity transistor can be constructed using a layout area ⅓ or less than the conventional structure, whereby high speed operation and high density packaging of transistors are achieved.

We claim:

1. 1 A semiconductor device comprising:
    a semiconductor body of single crystal, having a first protruding portion, the first protruding portion having an upper surface and sides;
    a first insulation film having a first opening, said first insulation film being located on said body such that said first opening exposes the upper surface of said first protruding portion;
    a first semiconductor region, of a second conductivity type opposite to a first conductivity type, forming a part of said first protruding portion;
    a second semiconductor region, of the first conductivity type, forming another part of said first protruding portion, the second semiconductor region being located on said first semiconductor region;
    a second insulation film formed on said second semiconductor region;
    at least one conductive layer formed in electrical connection with said first semiconductor region and extending from the electrical connection with the first semiconductor region to a location over said second insulation film on said second semiconductor region, the at least one conductive layer being located so as not to be in direct contact with the second semiconductor region; and
    first electrodes respectively provided in electrical connection with said at least one conductive layer, and a second electrode provided in electrical connection with the second semiconductor region, the first and second electrodes contacting the at least one conductive layer and the second semiconductor region, respectively, over the second semiconductor region.

2. A semiconductor device according to claim 1, wherein said conductive layer is made of polycrystalline silicon or metal silicide.

3. A semiconductor device according to claim 1, wherein said second semiconductor region is of said first conductivity type.

4. A semiconductor device according to claim 1, wherein said first electrode contacts the conductive layer over the first semiconductor region.

5. A semiconductor device according to claim 1, wherein said first semiconductor region and said second semiconductor region constitute respectively a base region and an emitter region of a bipolar transistor, and a collector region of the second conductivity type is formed in contact with a lower surface of said base region.

6. A semiconductor device according to claim 5, wherein said conductive layer is in contact with a side wall of said base region, and said second insulation film is formed on an upper surface of said emitter region.

7. A semiconductor device according to claim 5, wherein said first electrode and said second electrode respectively constitute a base electrode and an emitter electrode for said bipolar transistor.

8. A semiconductor device according to claim 6, wherein said conductive layer is made of polycrystalline silicon or metal silicide.

9. A semiconductor device according to claim 7, further comprising a polycrystalline silicon layer or metal silicide layer formed on said emitter, said emitter electrode being formed on said polycrystalline silicon layer or metal silicide layer.

10. A semiconductor device according to claim 1, wherein said second semiconductor region is directly on the first semiconductor region, the second semiconductor region has opposed sides extending at the periphery of the second semiconductor region, and said at least one conductive layer in electrical connection with the first semiconductor region extends past one of said opposed sides of the second semiconductor region and continues to a position on said second insulation film.

11. A semiconductor device according to claim 1, comprising two conductive layers formed in electrical connection with said first semiconductor region, said two conductive layers being in electrical connection with opposed ends of said first semiconductor region; and two first electrodes in electrical connection, respectively, with the two conductive layers, the two first electrodes contacting the respective conductive layers over the second semiconductor region.

12. A semiconductor device according to claim 11, wherein said second insulation film is in direct contact with said second semiconductor region.

13. A semiconductor device according to claim 5, wherein said second insulation film is in direct contact with said emitter region.

14. A semiconductor device according to claim 5, wherein said first electrodes contact said at least one conductive layer over the emitter region.

15. A semiconductor device comprising:
a semiconductor body of single crystal, having a first protruding portion, the first protruding portion having an upper surface and sides;
a first insulation film having a first opening, said first insulating film being located on said body such that said first opening exposes the upper surface of said first protruding portion;
a first semiconductor region, of a second conductivity type opposite to a first conductivity type, forming a part of said first protruding portion, said first semiconductor region having upper and lower and lower surfaces;
two second semiconductor regions of said first conductivity type, located respectively adjacent the opposed sides of said first semiconductor region, said two second semiconductor regions each having sides forming the sides of the first protruding portion;
a second insulation film formed on said first semiconductor region;
conductive layers formed respectively in electrical connection with said two second semiconductor regions, at the sides of said two semiconductor regions, and extending from said electrical connection to a location over said second insulation film on said first semiconductor region, so as not to be indirect contact with the first semiconductor region; and
first electrodes respectively provided in electrical connection with said conductive layers, and a second electrode in electrical connection with the first semiconductor region, the electrical connection of the first electrodes with the respective conductive layers, and the electrical connection between the second electrode and the first semiconductor region, each being positioned over the first semiconductor region.

16. A semiconductor device comprising:
a semiconductor body of single crystal, having a first protruding portion, the first protruding portion having an upper surface and sides, the sides forming the periphery of the first protruding portion;
a first insulation film having a first opening, said first insulation film being located on the surface of said body such that said first opening exposes the upper surface of said first protruding portion;
a first semiconductor region, of a second conductivity type opposite to a first conductivity type, forming a part of said first protruding portion;
a second semiconductor region, of said second conductivity type, formed beneath said first semiconductor region;
a second insulation film formed on said first semiconductor region;
a gate semiconductor region disposed so as to surround said first semiconductor region and to form the periphery of said first protruding portion, said gate semiconductor region being of said first conductivity type;
a conductive layer formed in electrical connection with said gate semiconductor region and extending from the electrical connection to a location over said second insulation film on said first semiconductor region, so as not to be in direct contact with the first semiconductor region; and
first, second and third electrodes provided in electrical connection, respectively, with said conductive layer, said first semiconductor region and said second semiconductor region, the electrical connection between the firs electrode and the conductive layer, and the electrical connection between the second electrode and first semiconductor region, each being over the first semiconductor region whereby a junction field effect transistor, with the first and second semiconductor regions respectively constituting source and drain regions of the transistor, is provided.

* * * * *